United States Patent
Deguchi

(10) Patent No.: US 7,576,001 B2
(45) Date of Patent: Aug. 18, 2009

(54) MANUFACTURING METHOD FOR SEMICONDUCTOR DEVICE

(75) Inventor: Takatoshi Deguchi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 310 days.

(21) Appl. No.: 11/182,851

(22) Filed: Jul. 18, 2005

(65) Prior Publication Data

US 2006/0199376 A1    Sep. 7, 2006

(30) Foreign Application Priority Data

Mar. 3, 2005    (JP)  ............................. 2005-058655

(51) Int. Cl.
*H01L 21/4763*    (2006.01)
(52) U.S. Cl. ................ 438/639; 438/637; 257/E21.579
(58) Field of Classification Search .................. 438/637, 438/695, 696, 639, 759
See application file for complete search history.

(56) References Cited

U.S. PATENT DOCUMENTS 6,180,518 B1 *  1/2001  Layadi et al. ............... 438/639
6,784,105 B1 *  8/2004  Yang et al. .................. 438/687
6,809,028 B2 * 10/2004  Chen et al. .................. 438/637
7,135,402 B2 * 11/2006  Lin et al. .................... 438/639

OTHER PUBLICATIONS

Patent Abstracts of Japan, Publication No. 2004-071731, dated Mar. 4, 2004.
Patent Abstracts of Japan, Publication No. 2004-071856, dated Mar. 4, 2004.

* cited by examiner

*Primary Examiner*—Alexander G Ghyka
*Assistant Examiner*—Reema Patel
(74) *Attorney, Agent, or Firm*—Westerman, Hattori, Daniels & Adrian, LLP.

(57) ABSTRACT

A semiconductor device manufacturing method for suppressing surface roughness of a Low-k insulating film during etching. In a laminated structure comprising a layer having formed thereon a lower copper wiring, a SiC film and a SiOC film, a via and an upper copper wiring are formed as follows. The SiOC film is etched to form a via hole opening that reaches the SiC film and then to form wiring grooves that communicate with the opening. Thereafter, when the SiC film on the bottom of the opening is etched to form a via hole, a deposited film of etching products is formed on surfaces of the via hole and the wiring grooves. This deposited film allows planarization of the SiOC film surface, which is exposed to plasma, formed thereon the via hole and the wiring grooves. Subsequently, formation of a Ta film and burying of plating copper are performed.

15 Claims, 11 Drawing Sheets

MANUFACTURING METHOD FOR SEMICONDUCTOR DEVICE

CROSS-REFERENCE TO RELATED APPLICATIONS

This application is based upon and claims the benefits of priority from the prior Japanese Patent Application No. 2005-58655, filed on Mar. 3, 2005, the entire contents of which are incorporated herein by reference.

BACKGROUND OF THE INVENTION

1. Field of the Invention

The present invention relates to a method for manufacturing a semiconductor device, and particularly to a method for manufacturing a semiconductor device having a multilayer wiring structure formed by using low dielectric constant insulating materials (Low-k materials) for an interlayer insulating film provided between wirings.

2. Description of the Related Art

In recent years, as high integration in semiconductor devices progresses, miniaturization and high densification of wirings has advanced and as a result, a wiring length increases. For wiring materials, aluminum is conventionally used, however, wiring delay accompanying the miniaturization of wirings becomes a problem. Therefore, a method of using copper in place of aluminum is nowadays performed in many cases. When using copper as wiring materials, it is difficult to transfer a wiring pattern to copper itself differently from aluminum. Therefore, a damascene technique is normally used in which a predetermined opening pattern is first formed on an interlayer insulating film and copper is buried therein to form vias and copper wirings. The damascene technique includes a single damascene technique and a dual damascene technique. The single damascene technique is a technique where a copper wiring and a via for connecting between the upper and lower copper wirings are formed separately. The dual damascene technique is a technique where a copper wiring and a via are integrally formed simultaneously.

Furthermore, the following method is also performed to avoid the problem of the wiring delay accompanying the miniaturization of wirings. That is, for the sake of reduction in a capacitance between wirings, a Low-k material having a dielectric constant lower than that of a conventional oxide film is used for forming the interlayer insulating film where a via or a copper wiring is formed by the burying of copper. The Low-k materials are roughly divided into two types of an inorganic one and an organic one, and generally used properly so as to satisfy characteristics required for each device. It is known that an insulating film (a Low-k insulating film) formed by using the Low-k materials has the following characteristics. That is, the insulating film is low in the film density and is poor in the mechanical strength as compared with a conventional oxide film and therefore, when the insulating film is etched, the etched surface is readily roughened.

Many multilayer wiring structures of semiconductor devices are formed using copper for the vias or the wirings as well as using the Low-k insulating film for the interlayer insulating film, as described above. In addition, the dual damascene technique is usually used for the formation method thereof. When forming the multilayer wiring structure by the dual damascene technique using the Low-k materials, the layer structure before the formation of the opening pattern for the via or for the copper wiring is roughly divided into two types. One is a layer structure where a Middle Etch Stopper (MES) such as a SiC film is sandwiched between the Low-k insulating film layers, and the other is a layer structure where no MES is sandwiched therebetween. In these two types of layer structures, the opening pattern for the via or for the copper wiring is formed by different methods.

For example, the layer structure having the MES is formed as follows. On a lower Copper wiring, an Etch Stop Layer (ESL), a lower Low-k insulating film, an MES and an upper Low-k insulating film are laminated in this order to form the layer structure. In the layer structure of this type, the opening patterns for the via that communicates with the lower copper wiring as well as for the upper copper wiring are formed by the dual damascene technique, for example, according to the following procedures. First, a via opening that communicates with the lower copper wiring through the upper and lower Low-k insulating films, the MES and the ESL is formed by etching. Next, a wiring groove that communicates with the opening is formed by etching on the upper Low-k insulating film. Finally, the exposed MES is etched. Thus, the opening patterns for the via and for the copper wiring are formed. As described above, in the case of the layer structure having the MES, formation of the opening pattern is completed by the etching of the MES. Therefore, the exposed Low-k insulating film such as a bottom of the wiring groove is exposed to plasma during the etching for a short period of time. As a result, surface roughness hardly occurs on the film.

On the other hand, the layer structure having no MES is formed, for example, as follows. On a lower copper wiring, an ESL and a Low-k insulating film are laminated in this order to form the layer structure. In the layer structure of this type, the opening patterns for the via that communicates with the lower copper wiring as well as for the upper copper wiring are formed by the dual damascene technique, for example, according to the following procedures. First, the Low-k insulating film is etched almost to the ESL to form a via opening. Next, the Low-k insulating film is etched to a predetermined depth to form a wiring groove that communicates with the opening. Finally, the ESL is etched to expose the lower copper wiring. As described above, in the case of the layer structure having no MES, formation of the opening patterns for the via and for the copper wiring is completed by the etching of the ESL. Therefore, the exposed Low-k insulating film such as a bottom of the wiring groove is exposed to plasma during the etching of the ESL for a relatively long period of time. As a result, surface roughness readily occurs particularly on the bottom of the wiring groove.

However, from the standpoint of the device performance, the layer structure having the MES is disadvantageous in that the very presence of the MES leads to increase in the dielectric constant. Therefore, the layer structure having no MES is nowadays employed frequently.

For the sake of suppressing the above-described surface roughness of the Low-k insulating film in forming the opening pattern for one layer on the Low-k insulating film, for example, the following two experiments are heretofore performed. One experiment is that using fluorocarbon as a reactive gas, the etching of the Low-k insulating film is performed at a low speed (see, Japanese Unexamined Patent Publication No. 2004-071731). The other experiment is that using hydrofluorocarbon as a reactive gas, a reaction for forming a thin film on the surface of the Low-k insulating film and a reaction for etching the surface of the Low-k insulating film are allowed to proceed at the same time (see, Japanese Unexamined Patent Publication No. 2004-071856).

As described above, the layer structure having no MES using the Low-k insulating film has a problem that in terms of production, the surface roughness readily occurs on the bottom of the groove formed on the Low-k insulating film.

Therefore, when burying copper in the finally obtained opening pattern to form the copper wiring, an uneven surface is formed between the copper wiring and the Low-k insulating film. More properly, a thin barrier metal layer having an uneven surface is formed on the Low-k insulating film prior to the burying of copper. As a result, an uneven surface is formed between the copper wiring and the Low-k insulating film.

As described above, the miniaturization of the copper wiring in the recent semiconductor devices has been advanced. Therefore, in order to bury as much copper as possible in a minute opening pattern for a via or for a copper wiring, a barrier metal film having a very thin thickness must be formed on the bottoms or side walls of the via hole and wiring groove formed on the Low-K insulating film. However, when forming a thin barrier metal film on the groove bottom having an uneven surface due to the surface roughness, also the barrier metal has an uneven surface. Furthermore, the following problems may occur depending upon the degree of unevenness. One problem is that a barrier metal film including a part having an extremely thin film thickness as compared with that in the other part may be formed on the groove bottom. The other problem is that a part having no barrier metal film may be formed on the groove bottom.

When a barrier metal film having an uneven surface is formed as described above, the following problem may occur. That is, when stress migration is caused in the copper wiring by heat stress, a large stress is applied between the barrier metal and the copper wiring. As a result, a thin part in the barrier metal is broken and copper is blown out from the broken part, whereby the copper wiring is broken.

In addition, when forming the copper wiring, seed copper is first formed on the barrier metal and then, copper plating is performed to bury copper in the opening pattern. However, when a barrier metal film having an uneven surface is formed, also the seed copper has an uneven surface and therefore, orientation in the plating copper deteriorates. As a result, the following problem may occur. That is, when a large current flows through the thus formed copper wiring, flow of the current is lowered in a part having poor orientation and excessive stress is applied thereto, whereby electromigration is caused and the copper wiring is broken.

Thus, the surface roughness of the Low-k insulating film may cause deterioration in barrier characteristics of the barrier metal or in orientation of the copper wiring. Therefore, the surface roughness may contribute to reduction in reliability of the semiconductor device.

Conventionally, some proposals are made for the purpose of suppressing the surface roughness of the Low-K insulating film. Particularly, a method of surely suppressing the surface roughness of the Low-k insulating film is required in order to realize a highly reliable semiconductor device having a multilayer wiring structure formed using the dual damascene technique.

SUMMARY OF THE INVENTION

In view of the foregoing, it is an object of the present invention to provide a method for manufacturing a highly reliable semiconductor device having a multilayer wiring structure.

To accomplish the above object, according to one aspect of the present invention, there is provided a method for manufacturing a semiconductor device having a multilayer wiring structure.

This method comprises the steps of:

forming an etch stop layer on a layer having formed thereon a lower copper wiring;

forming an interlayer insulating film on the etch stop layer;

etching the interlayer insulating film to form an opening that reaches the etch stop layer;

etching the interlayer insulating film to form a wiring groove that communicates with the opening; and etching the etch stop layer on the bottom of the opening to form a via hole as well as forming a deposited film of etching products on surfaces of the via hole and the wiring groove.

To accomplish the above object, according to another aspect of the present invention, there is provided a method for manufacturing a semiconductor device having a multilayer wiring structure. This method comprises the steps of:

forming an etch stop layer on a layer having formed thereon a lower copper wiring;

forming an interlayer insulating film on the etch stop layer;

etching the interlayer insulating film to form an opening that reaches the etch stop layer;

etching the interlayer insulating film to form a wiring groove that communicates with the opening;

etching the etch stop layer on the bottom of the opening to form a via hole that communicates with the lower copper wiring; and forming an insulating thin film on surfaces of the via hole and the wiring groove.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 3A shows a state where surface roughness occurs. FIG. 3B shows a state where surface roughness is controlled.

DESCRIPTION OF THE PREFERRED EMBODIMENTS

Figure 1:
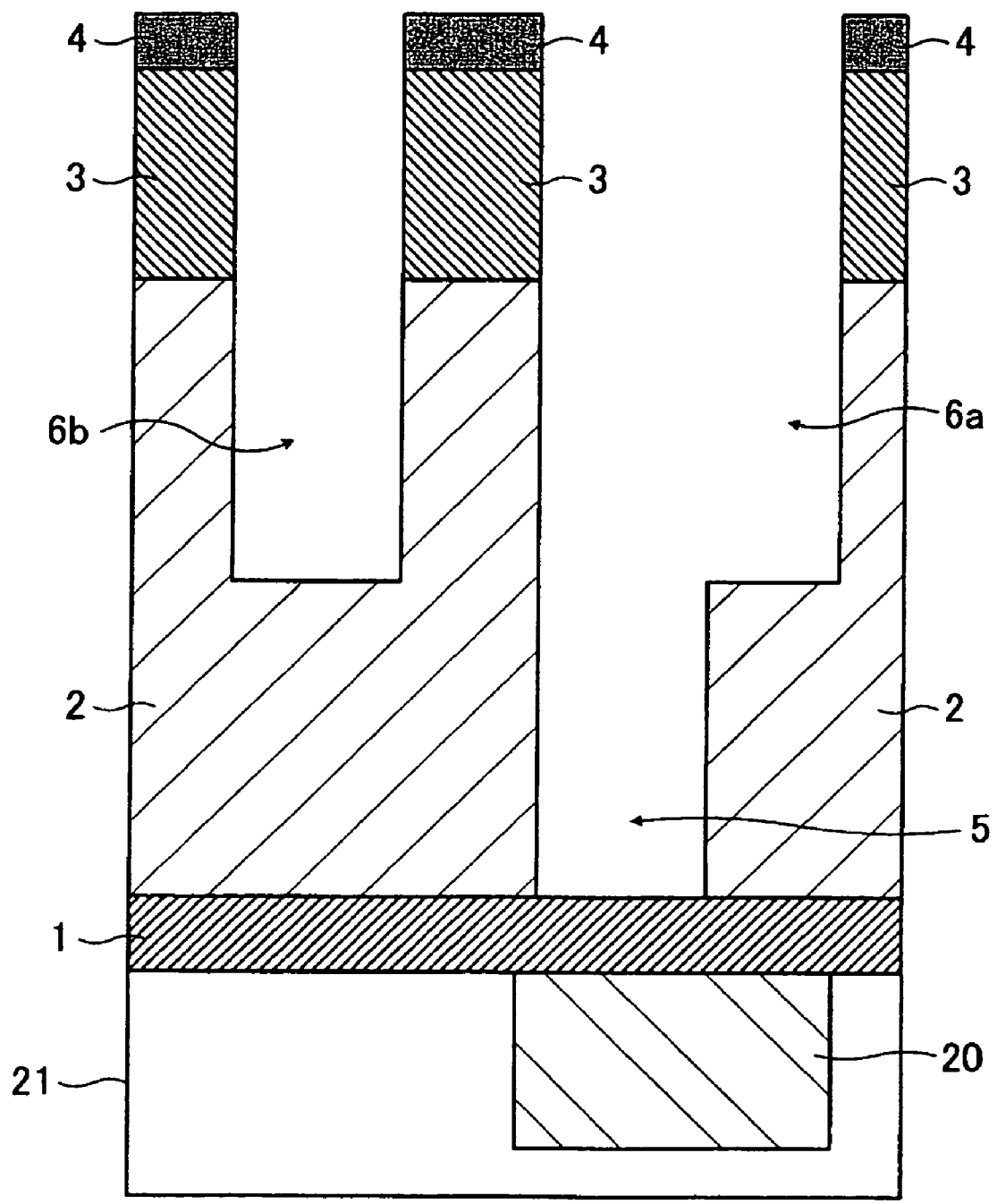
FIG. 1 is a schematic sectional view showing an essential part of a first formation step of an opening pattern according to a first embodiment.

Preferred embodiments of the present invention will be described below with reference to the accompanying drawings, wherein like reference numerals refer to like elements throughout.

First, a first embodiment is described.

Figure 2:
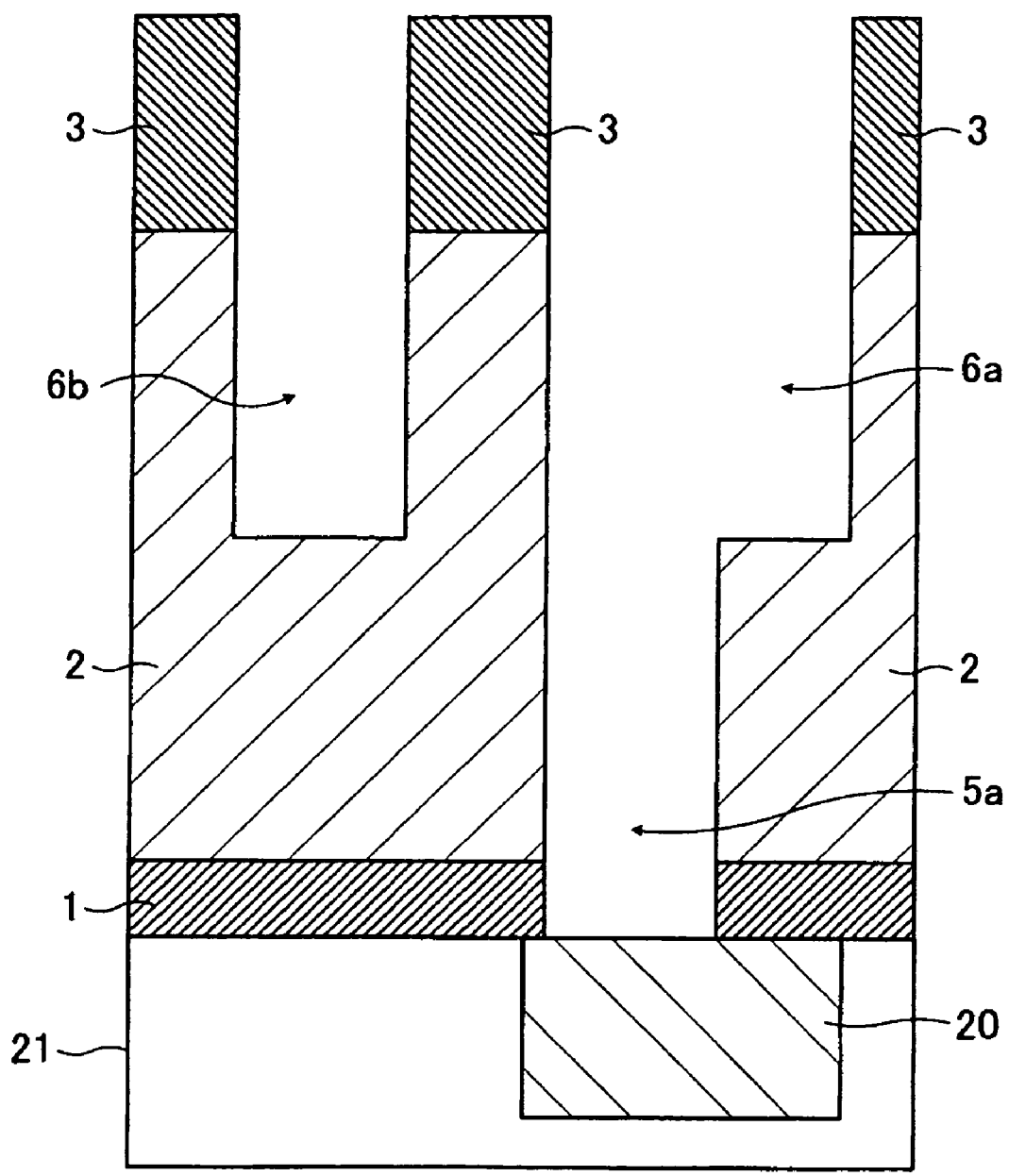
FIG. 2 is a schematic sectional view showing an essential part of a second formation step of an opening pattern according to a first embodiment.

FIG. 1 is a schematic sectional view showing an essential part of a first formation step of an opening pattern according to the first embodiment. FIG. 2 is a schematic sectional view showing an essential part of a second formation step of the opening pattern according to the first embodiment.

In the first embodiment, a layer structure having no MES is used. As shown in FIG. 1, this layer structure is formed by laminating a Sic film 1, a SiOC film 2, a TEOS (tetra-ethoxysilane) film 3 and a $Si_3N_4$ (SiN) film 4 in this order. More specifically, on a layer 21 having formed thereon a lower copper wiring 20 electrically connected to transistors (not shown), the SiC film 1 having a film thickness of about 50 nm is formed as an ESL. On the SiC film 1, the SiOC film 2 having a film thickness of about 450 nm is formed using a Low-k insulating film as an interlayer insulating film. On the SiOC film 2, the TEOS film 3 having a film thickness of about 100 nm and the $Si_3N_4$ (SiN) film 4 having a film thickness of about 30 nm are formed as hard masks.

In the layer structure of this type, an opening pattern is formed by a dual damascene technique according to the following procedures. First, using as a mask the SiN film 4 where a formation region of a via hole opening 5 is opened, the TEOS film 3 and the SiOC film 2 are etched until the Sic film 1 is exposed, whereby the opening 5 is formed. After the formation of the opening 5, the SiOC film 2 is in turn plasma etched to a suitable depth using as a mask the SiN film 4 where a formation region of wiring grooves 6a and 6b each having a suitable width is opened, whereby the grooves 6a and 6b are formed. As a result, the layer structure shown in FIG. 1 is obtained. After the formation of the opening 5 and the grooves 6a and 6b, the exposed SiC film 1 is removed by etching until the lower copper wiring 20 is exposed. Thus, a via hole 5a and the wiring grooves 6a and 6b are formed. As a result, the layer structure shown in FIG. 2 is obtained. During the etching, the SiN film 4 as a hard mask is also removed with the SiC film 1. The grooves 6a and 6b can be formed, for example, to have a size of about 140 nm in width and about 200 nm in depth.

Herein, etching conditions of the SiC film 1 are described.

When forming the via hole 5a, the etching of the SiC film 1 is performed by overall plasma etching. Therefore, when the uppermost SiN film 4 is entirely eliminated during the etching, the lower TEOS film 3 is in turn exposed to plasma during the etching. However, when the TEOS film 3 is excessively etched, the following problem occurs. That is, when performing a CMP (Chemical Mechanical Polishing) process after burying copper in the via hole 5a and the wiring grooves 6a and 6b as described later, each copper buried in the wiring grooves 6a and 6b is prevented from being separated from each other. Furthermore, a method of previously forming the TEOS film 3 thickly may be used in view of the above-described problem. However, this method incurs reduction in dimensional accuracy at the time of forming a deep opening pattern or increase in material cost. Therefore, the etching conditions of the SiC film 1 must be set such that a selected ratio with the TEOS film 3 as an oxide film can be guaranteed.

Further, a side wall of the via hole 5a as well as bottoms or side walls of the wiring grooves 6a and 6b is exposed to plasma during the etching of the SiC film 1. Therefore, the etching conditions of the SiC film 1 must be set such that surface roughness can be prevented from occurring on these parts, particularly, on the bottoms of the wiring grooves 6a and 6b where the surface roughness readily occurs.

Accordingly, for the etching of the SiC film 1, hydrofluorocarbon such as $CH_2F_2$ or $CHF_3$, or fluorocarbon such as $C_4F_6$ is herein used as an etching gas.

When using, for example, a $CH_2F_2$ gas as an etching gas, the etching of the SiC film 1 can be performed under the following conditions. That is, a mixed gas comprising the $CH_2F_2$ gas with a flow rate of 1 to 200 sccm, an $O_2$ gas with a flow rate of 1 to 200 sccm, a $N_2$ gas with a flow rate of 1 to 200 scam and an Ar gas with a flow rate of 0 to 1000 sccm is used under the conditions that a pressure is 1 (0.133 Pa) to 300 mTorr, a supply power is 100 to 1000 W and a magnetic field is 0 to 100 G. Preferably, the etching of the SiC film 1 is performed under the following conditions. That is, a mixed gas comprising the $CH_2F_2$ gas with a flow rate of 5 to 30 scam, an $O_2$ gas with a flow rate of 1 to 30 scam and a $N_2$ gas with a flow rate of 10 to 100 sccm is used under the conditions that a pressure is 5 to 50 mTorr, a supply power is 50 to 300 W and a magnetic field is 0 to 50 G. In the above-described conditions, 1 sccm=1 mL/min (at 0° C., 101.3 kPa), 1 mTorr=0.133322 Pa (the same is true in the following cases).

In addition thereto, when using a $CHF_3$ gas, the etching of the SiC film 1 may be performed under the following conditions. That is, the $CHF_3$ gas flow rate is set to 1 to 200 sccm and the other conditions are set to the same as in the case of using a $CH_2F_2$ gas. Also when using a $C_4F_6$ gas, the etching of the SiC film 1 may be performed under the following conditions. That is, the $C_4F_6$ gas flow rate is set to 1 to 200 sccm and the other conditions are set to the same as in the case of using a $CH_2F_2$ gas or a $CHF_3$ gas.

When performing the etching of the SiC film 1 under these conditions, the following advantages can be obtained. That is, the selected ratio with the TEOS film 3 is guaranteed so that defects between wirings can be prevented from occurring also in the subsequent CMP step. Further, even after removal of the SiC film 1, the surface roughness on the side wall of the via hole 5a as well as on the bottoms or the side walls of the wiring grooves 6a and 6b is effectively prevented from occurring and as a result, the surfaces thereof can be planarized.

Figure 3A:
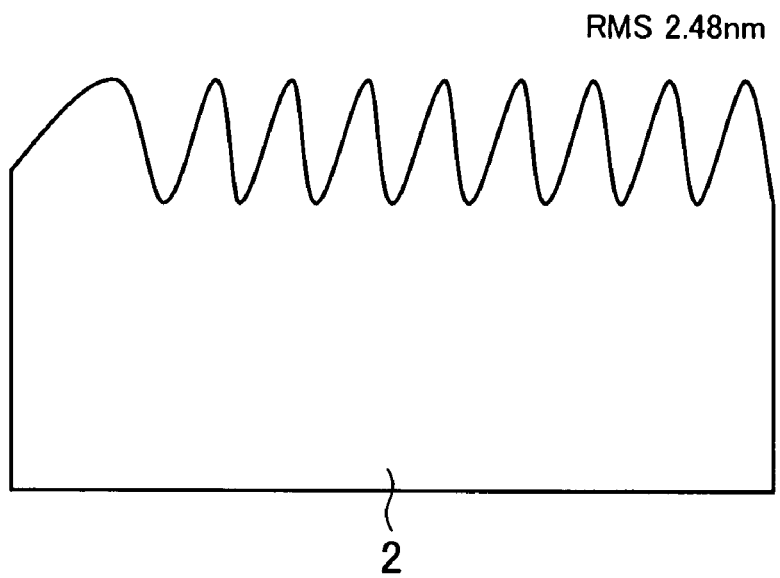
FIGS. 3A and 3B are schematic sectional views showing a part of a bottom of a wiring groove.
Figure 3B:
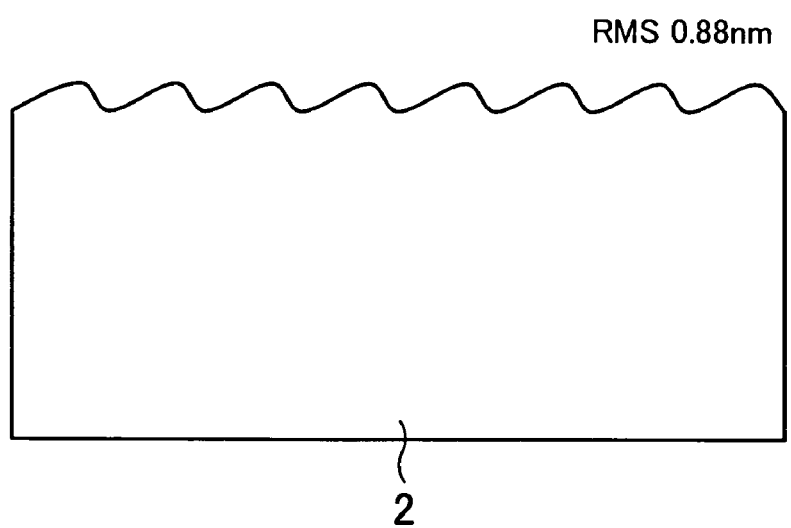

FIGS. 3A and 3B are schematic sectional views showing a part of the bottom of the wiring groove. FIG. 3A shows a state where surface roughness occurs. FIG. 3B shows a state where surface roughness is suppressed. In FIGS. 3A and 3B, the same elements as those described in FIGS. 1 and 2 are indicated by the same reference numerals as in FIGS. 1 and 2.

When performing the etching of the SiC film 1 under the usual conditions, there is caused a problem, for example, as shown in FIG. 3A. That is, about 2.48 nm of the surface roughness (RMS) based on the JIS standard occurs on the bottoms of the wiring grooves 6a and 6b formed on the SiOC film 2. The surface roughness of this level can be sufficiently observed also with a scanning electron microscope (SEM).

On the other hand, when suitably setting the etching conditions in the above-described range, there can be provided an advantage as shown in FIG. 3B. That is, the surface roughness on the bottoms of the wiring grooves 6a and 6b can be prevented from occurring. For example, the RMS roughness on the bottoms can be suppressed to about 0.88 nm. Furthermore, in this case, drastic improvement in the surface roughness can be observed also with an SEM.

In these samples after the etching of the Sic film 1 under different etching conditions, formation up to a barrier metal and a copper wiring are performed to construct a multilayer wiring structure according to the procedures as described later. The resulting layer structures are subjected to an electromigration resistance test. As a result, it is found that the layer structure having the RMS roughness of about 0.88 nm exhibits about twice as much electromigration resistance as the layer structure having the RMS roughness of about 2.48 nm does.

When the RMS roughness of the via hole 5a or the wiring grooves 6a and 6b is in excess of 1 nm, the surface roughness thereof can be easily observed with a SEM. In this case, when the barrier metal is thinly formed to a film thickness of, for example, about 10 nm, the barrier metal surface is formed to have a relatively large unevenness. As a result, a possibility of causing deterioration in barrier characteristics or in orientation of the copper wiring increases. Accordingly, it is desired that the etching conditions of the SiC film 1 is set such that the surface roughness of the via hole 5a or of the wiring grooves 6a and 6b within the SiOC film 2 after the etching of the film 1 is 1 nm or less in terms of the RMS roughness.

When suitably setting the etching conditions of the SiC film 1 to prevent the surface roughness from occurring in the via hole 5a or in the wiring grooves 6a and 6b as described above, a step of separately removing etching products produced during the etching and adhered to the bottoms or side walls may be added.

Alternatively, the etching products may be allowed to remain adhered to the bottoms or side walls without being removed. When performing the etching of the SiC film 1 under the above-described conditions, a C—H—O—F—Si-based or C—H—F—Si-based substance is mainly produced as the etching products. As a result of the investigation, the following facts are found. That is, when the etching products are allowed to remain adhered to the bottoms or side walls without being removed, adhesion between the barrier metal and the SiOC film 2 is improved as compared with the case where the barrier metal is directly formed on the SiOC film 2. Accordingly, the etching products may be removed from the bottoms or side walls or may be allowed to remain adhered to the bottoms or side walls, depending on characteristics required for the devices to be formed.

Furthermore, when performing the etching of the SiC film 1, the flow rate of a $CH_2F_2$ gas, a $CHF_3$ gas or a $C_4F_6$ gas may be set larger than that of an $O_2$ gas. As a result, the etching products are more easily adhered to the etched surface, specifically, to the bottoms or side walls of the via hole 5a or wiring grooves 6a and 6b.

As described above, during the etching of the SiC film 1, also the SiOC film 2 is exposed to plasma. Therefore, when performing the etching under the usual conditions, the surface roughness occurs on the wiring grooves 6a and 6b, particularly, on the bottoms thereof. However, when using an adhesion phenomenon of the etching products, the following advantage can be obtained. That is, when producing more etching products to intentionally form a deposited film thereof on the etched surface to a thickness of, for example, about 1 to 20 nm, the side wall of the via hole 5a and the bottoms or side walls of the wiring grooves 6a and 6b can be even more planarized.

Figure 4:
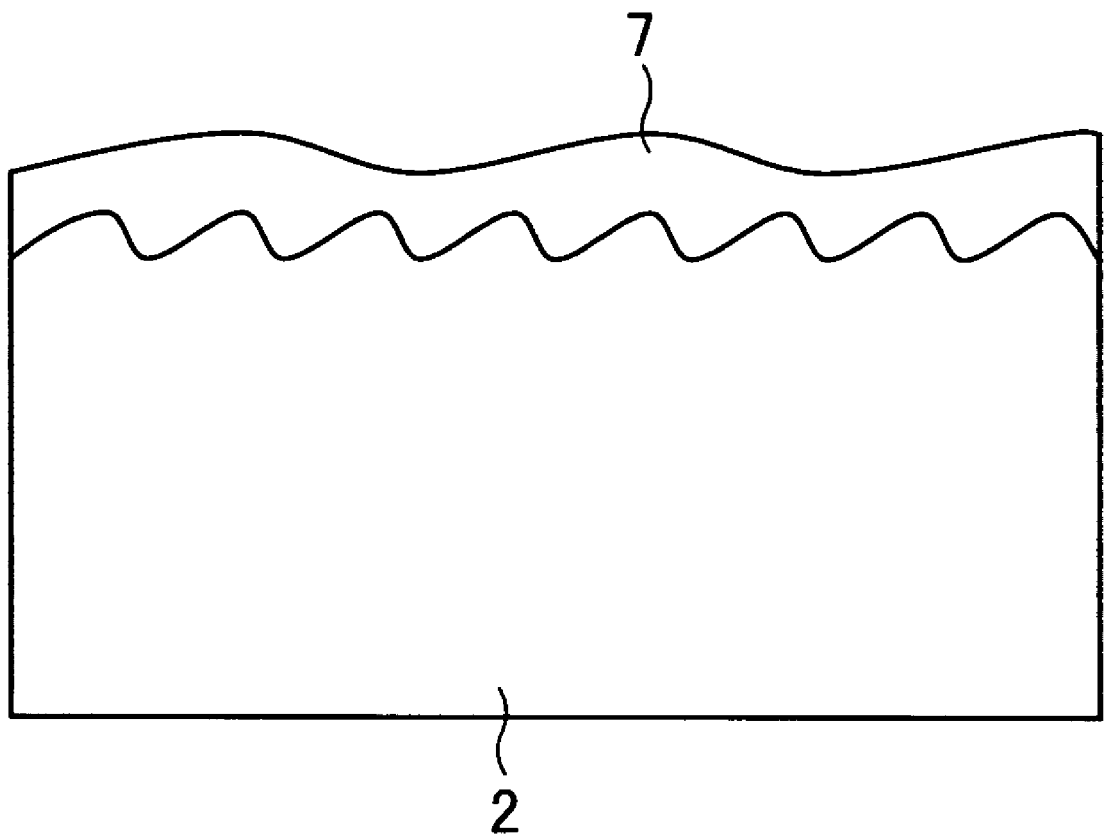
FIG. 4 is a schematic sectional view showing a part of a bottom of a wiring groove where a deposited film of etching products is formed.

FIG. 4 is a schematic sectional view showing a part of the bottom of the wiring groove where the deposited film of the etching products is formed. In FIG. 4, the same elements as those described in FIGS. 1 and 2 are indicated by the same reference numerals as in FIGS. 1 and 2.

When performing the etching of the SiC film 1 under conditions where the etching products are easily produced, there can be provided an advantageous state, for example, as shown in FIG. 4. That is, a deposited film 7 of the etching products is formed on the bottoms of the wiring grooves 6a and 6b and therefore, the surfaces of the bottoms are even more planarized. As a result, planarization of a subsequently formed barrier metal can be realized, so that the barrier characteristics thereof can be improved.

In this layer structure, formation up to the barrier metal and the copper wiring are performed according to the procedures as described later. The resulting layer structure is subjected to the electromigration resistance test. As a result, it is found that this layer structure exhibits about 2.4 times as much electromigration resistance as the layer structure (RMS roughness: about 2.48 nm) in the FIG. 3A does, and exhibits about 1.2 times as much electromigration resistance as the layer structure (RMS roughness: about 0.88 nm) in the FIG. 3B does.

Furthermore, since the deposited film 7 of the etching products is formed between the barrier metal and the SiOC film 2, adhesion of the barrier metal can be improved.

When the etching products are thus left intentionally on the etched surface, the etching products may adhere also to the bottom of the via hole 5a. However, in the dual damascene technique, the amount of the etching products adhered to the bottom of the via hole 5a is extremely reduced as compared with that adhered to the bottoms of the wiring grooves 6a and 6b. This is because the bottom of the via hole 5a has a high aspect ratio. Further, even in the case where the etching products are adhered to the bottom of the via hole 5a, when subsequently performing a sputtering operation, the etching products on the sputtered part can be removed selectively and easily.

After thus performing the etching of the SiC film 1 under predetermined conditions, the formation of the barrier metal and the formation of the via and the upper copper wiring are sequentially performed as described above.

Figure 5:
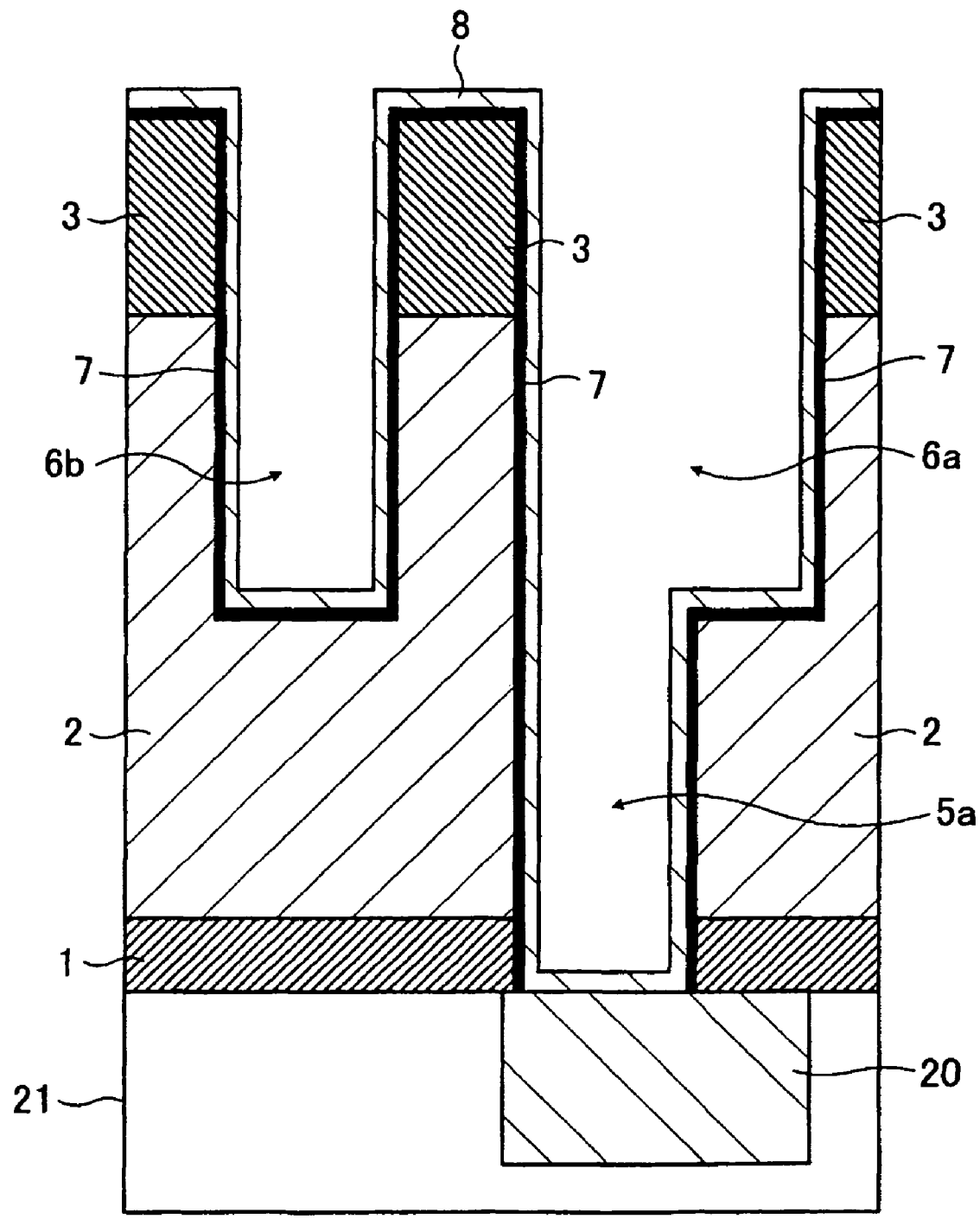
FIG. 5 is a schematic sectional view showing an essential part of a formation step of a barrier metal according to a first embodiment.
Figure 6:
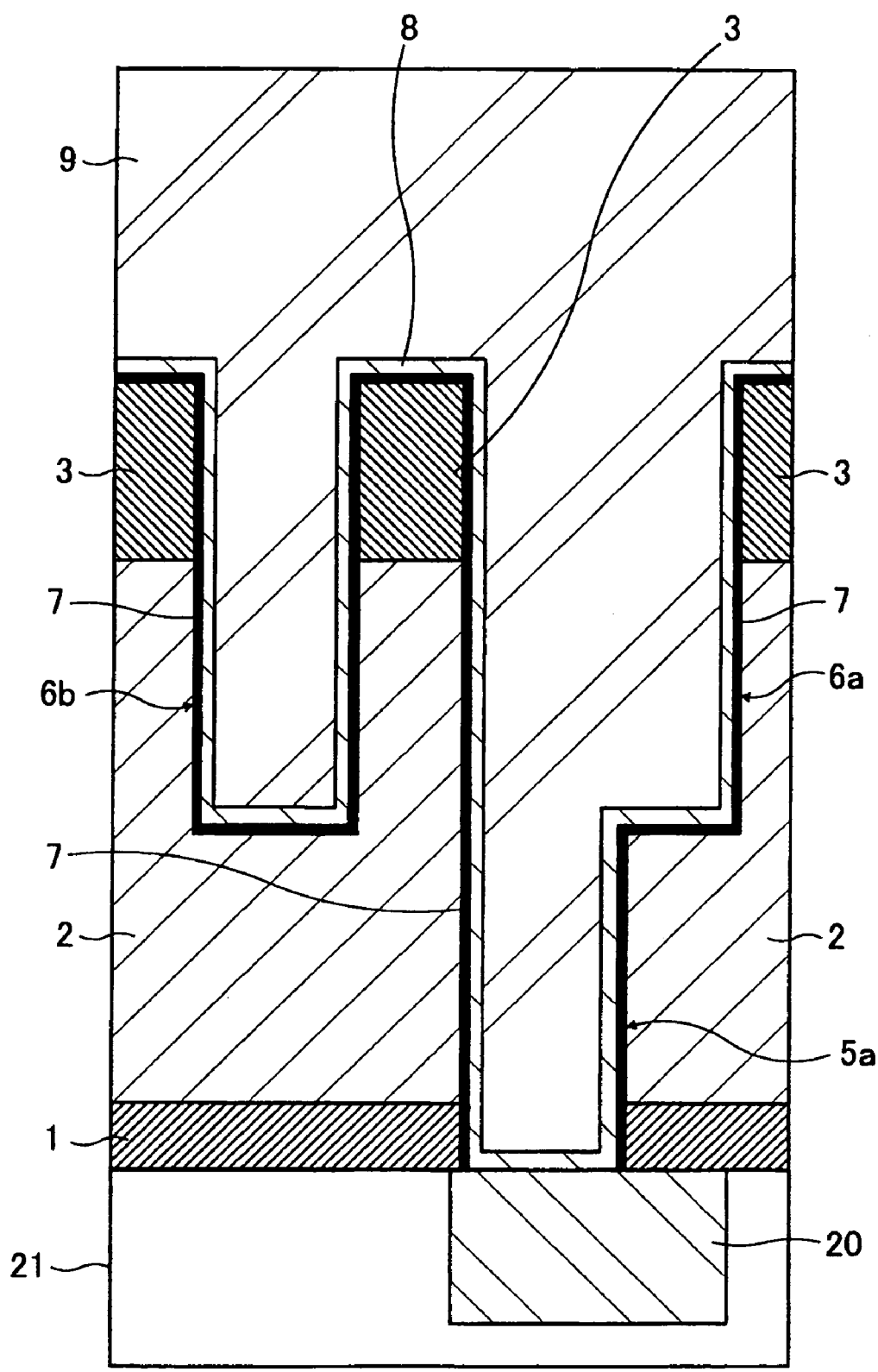
FIG. 6 is a schematic sectional view showing an essential part of a burying step of copper according to a first embodiment.
Figure 7:
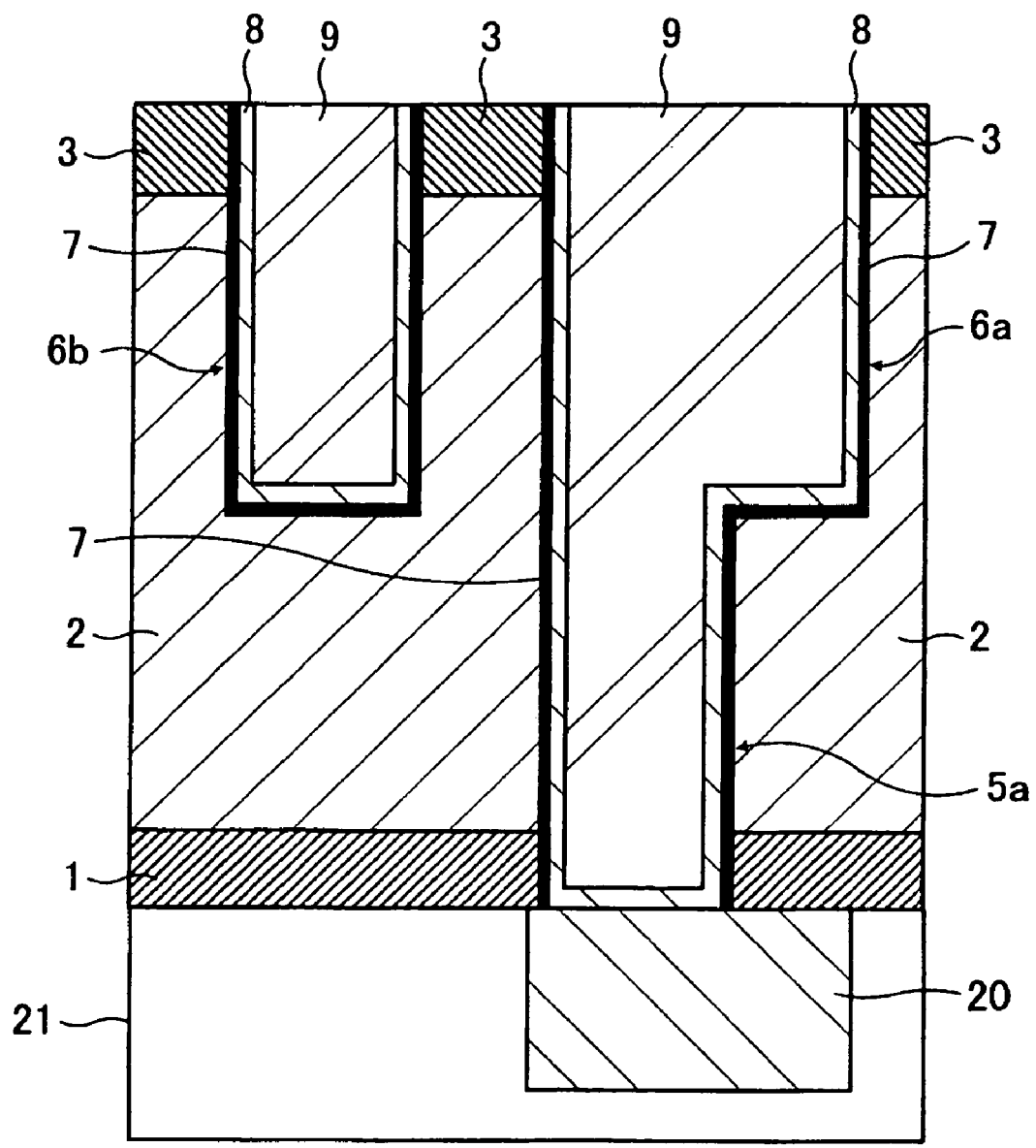
FIG. 7 is a schematic sectional view showing an essential part of a formation step of a via and a Cu wiring according to a first embodiment.

FIG. 5 is a schematic sectional view showing an essential part of a formation step of a barrier metal according to the first embodiment. FIG. 6 is a schematic sectional view showing an essential part of a burying step of copper according to the first embodiment. FIG. 7 is a schematic sectional view showing an essential part of a formation step of a via and a copper wiring according to the first embodiment. In FIGS. 5 to 7, the same elements as those described in FIGS. 1 and 2 are indicated by the same reference numerals as in FIGS. 1 and 2.

In the layer structure after the etching of the SiC film 1, a Ta film 8 having a film thickness of about 2 to 25 nm is first formed as a barrier metal throughout the whole area of the structure, as shown in FIG. 5. The Ta film 8 is formed by a DC magnetron sputtering method using a Ta target. The Ta film 8 can be formed, for example, under the following conditions. That is, a target DC power is 1 to 100 kW, a substrate bias is 0 to 2000 W, a pressure is 0.1 to 100 mTorr and a wafer temperature is 0 to 200° C. When suitably setting the etching conditions of the SiC film 1, the Ta film 8 is formed with good planarity.

Further, at the formation of the Ta film 8, the bottom of the via hole 5a is preferentially sputtered. Therefore, even when the etching products are adhered to the bottom of the via hole 5a during the etching of the SiC film 1 as described above, the etching products are easily removed at the formation of the Ta film 8. As a result, the Ta film 8 is formed in a state where the etching products are removed. That is, the film 8 is directly formed on the lower copper wiring 20.

After the formation of the Ta film 8, seed copper (not shown) is formed thereon. Then, copper plating is performed to bury plating copper 9 in the via hole 5a and the wiring grooves 6a and 6b, as shown in FIG. 6. On this occasion, when the Ta film 8 is formed with good planarity, the seed copper is also formed with good planarity. As a result, the plating copper 9 is also formed with good orientation.

After the burying of the plating copper 9, as shown in FIG. 7, the plating copper 9 and the Ta film 8 are shaved off by the CMP process until the TEOS film 3 is exposed. As a result, each plating copper 9 buried in the wiring grooves 6a and 6b is separated from each other. Thus, the upper copper wiring is completed.

As described above, according to the semiconductor device manufacturing method of the first embodiment, when forming the via and the copper wirings in the layer structure having no MES by using the dual damascene technique, the etching conditions of the SiC film 1 after the formation of the opening 5 and the wiring grooves 6a and 6b on the SiOC film 2 are suitably set. More specifically, the etching conditions of the SiC film 1 are set such that the surface roughness of the wiring grooves 6a and 6b formed within the SiOC film 2 after the etching of the film 1 is prevented from occurring. Alternatively, the etching conditions of the SiC film 1 are set such that the etching products are intentionally adhered to the etched surface. As a result, the side wall of the via hole 5a and the bottoms or side walls of the wiring grooves 6a and 6b can be planarized. Therefore, the subsequently formed Ta film 8 or seed copper is thinly formed with good planarity, so that the plating copper 9 can be formed with good orientation. Accordingly, reliability of the semiconductor device comprising the fine multilayer wiring structure having no MES can be remarkably improved.

In addition, when the deposited film 7 of the etching products is formed particularly at least on the bottoms of the wiring grooves 6a and 6b, in which the surface roughness easily occurs, among the side wall of the via hole 5a and the bottoms or side walls of the wiring grooves 6a and 6b, reliability of the semiconductor device can be improved.

Next, a second embodiment of the present invention is described.

The second embodiment is different from the first embodiment in the following point. That is, after formation of the via hole opening as well as of the wiring grooves on the Low-k insulating film, the ESL is etched to expose the lower copper wiring 20 and then the insulating thin film is formed on the surface of the Low-k insulating film.

Figure 8:
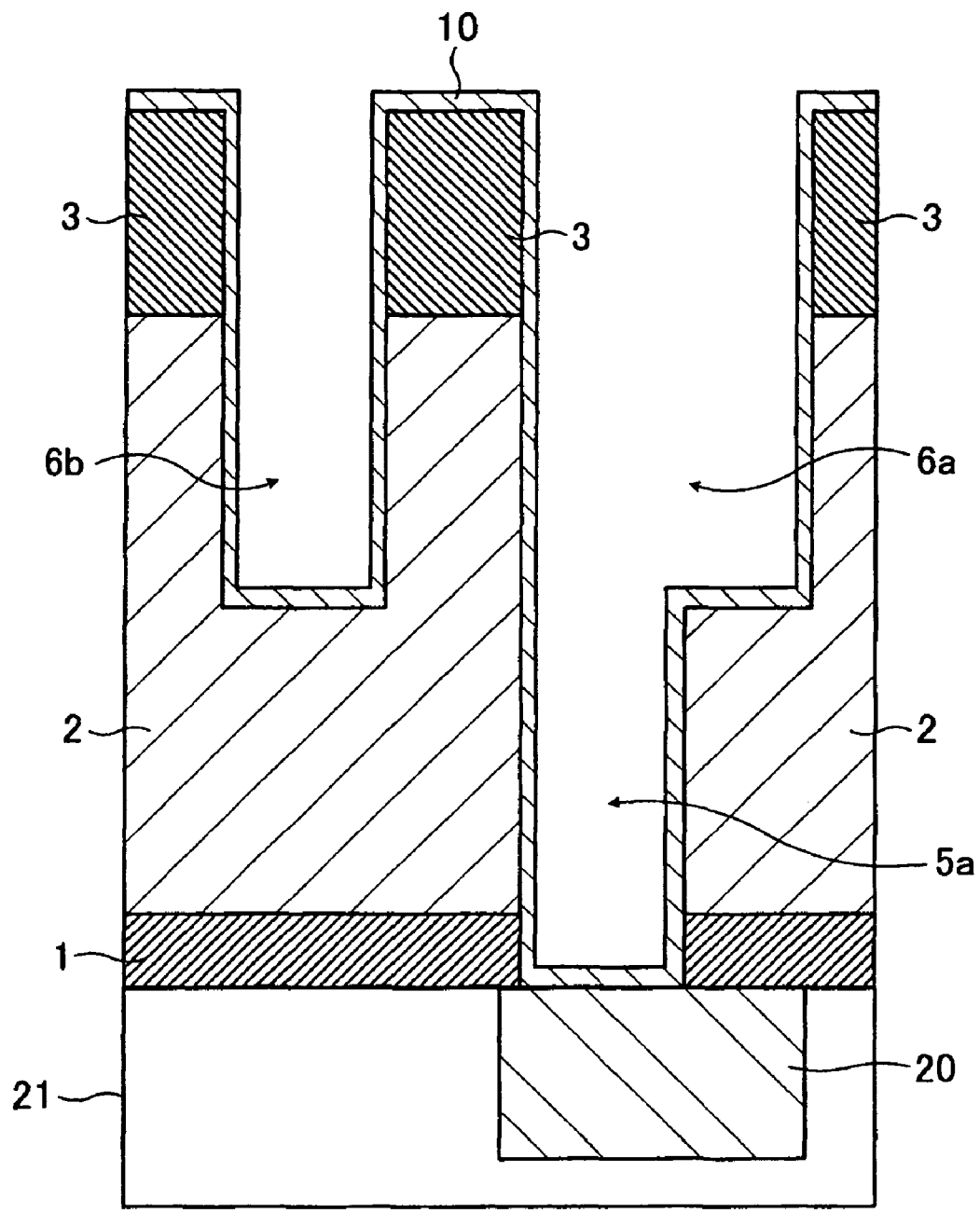
FIG. 8 is a schematic sectional view showing an essential part of a formation step of a thin film according to a second embodiment.

FIG. 8 is a schematic sectional view showing an essential part of a formation step of the thin film according to the second embodiment. In FIG. 8, the same elements as those described in FIGS. 1 and 2 are indicated by the same reference numerals as in FIGS. 1 and 2.

In the second embodiment, the following procedures are performed. First, the SiC film 1 is etched to form the layer structure having a state shown in FIG. 2 from the structure having a state shown in FIG. 1. For the etching of the SiC film 1, hydrofluorocarbon such as $CH_2F_2$ or $CHF_3$, or fluorocarbon such as $C_4F_6$ may be used as an etching gas in the same manner as in the first embodiment.

When using, for example, a $CHF_3$ gas as an etching gas, the etching of the SiC film 1 can be performed under the following conditions. That is, a mixed gas comprising the $CHF_3$ gas with a flow rate of 1 to 200 sccm, an $O_2$ gas with a flow rate of 1 to 200 sccm, a $N_2$ gas with a flow rate of 1 to 200 sccm and an Ar gas with a flow rate of 0 to 1000 sccm is used under the conditions that a pressure is 1 to 300 mTorr, a supply power is 100 to 1000 W and a magnetic field is 0 to 100 G. Preferably, the etching of the SiC film 1 is performed under the following conditions. That is, a mixed gas comprising the $CHF_3$ gas with a flow rate of 5 to 30 sccm, an $O_2$ gas with a flow rate of 1 to 30 sccm and a $N_2$ gas with a flow rate of 10 to 100 sccm is used under the conditions that a pressure is 5 to 50 mTorr, a supply power is 50 to 300 W and a magnetic field is 0 to 50 G.

In addition thereto, when using a $CH_2F_2$ gas, the etching of the SiC film 1 may be performed under the following conditions. That is, the $CH_2F_2$ gas flow rate is set to 1 to 200 sccm and the other conditions are set to the same as in the case of using a $CHF_3$ gas. Also when using a $C_4F_6$ gas, the etching of the SiC film 1 may be performed under the following conditions. That is, the $C_4F_6$ gas flow rate is set to 1 to 200 sccm and the other conditions are set to the same as in the case of using a $CHF_3$ gas or a $CH_2F_2$ gas.

When suitably setting the etching conditions as described above, there can be provided the following advantages. That is, the surface roughness on the side wall of the via hole 5a as well as on the bottoms or side walls of the wiring grooves 6a and 6b can be effectively prevented from occurring. For example, the RMS roughness can be suppressed to 1 nm or less.

The etching products which may be produced during the etching may be removed or may be left without being removed. However, in order to form the after-mentioned thin film with good uniformity, it is preferred that the etching products are removed.

After the etching of the SiC film 1, in the second embodiment, an insulating thin film 10 is formed throughout the whole area of the layer structure as shown in FIG. 8. For the thin film 10, a film which can be formed by plasma, such as a SiO film, a SiOC film, a SiC film, a SiN film, an amorphous carbon film or a hydrocarbon film is preferably used in terms of production. This is because formation of the thin film 10 can be performed in succession to the etching of the SiC film 1 as an ESL. This thin film 10 is formed to a film thickness of, for example, 30 nm or less, preferably about 1 to 20 nm.

When thus forming the thin film 10, the side wall of the via hole 5a and the bottoms or side walls of the wiring grooves 6a and 6b can be planarized. Incidentally, the amount of the thin film formed on the bottom of the via hole 5a is extremely reduced as compared with that formed on the bottoms of the wiring grooves 6a and 6b. This is because the bottom of the via hole 5a has a high aspect ratio. Furthermore, when performing a sputtering operation after the formation of the thin film 10, the thin film 10 on the sputtered part can be removed selectively and easily.

After the formation of the thin film 10, the formation of the barrier metal and the formation of the via and the upper copper wiring are sequentially performed.

Figure 9:
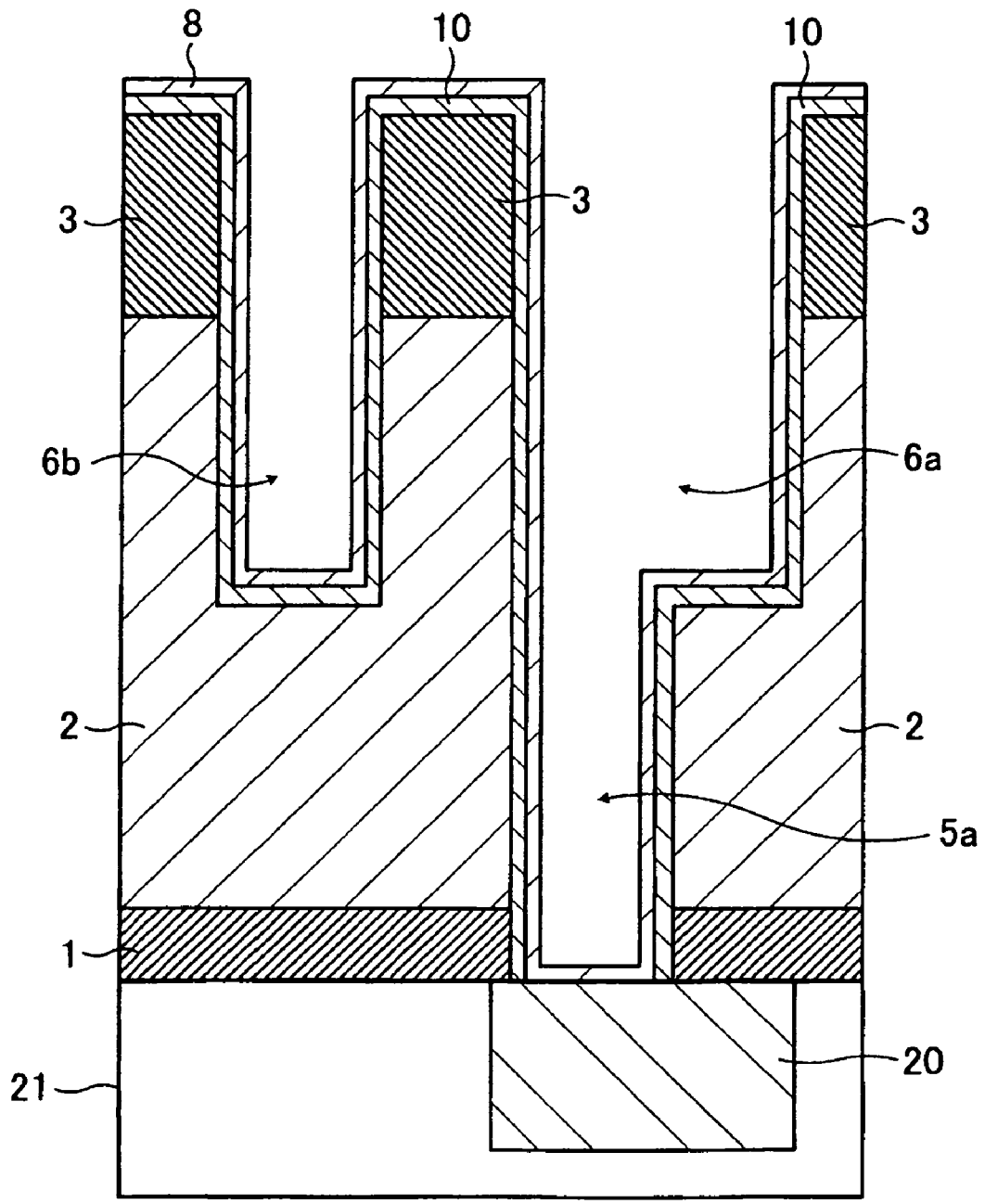
FIG. 9 is a schematic sectional view showing an essential part of a formation step of a barrier metal according to a second embodiment.
Figure 10:
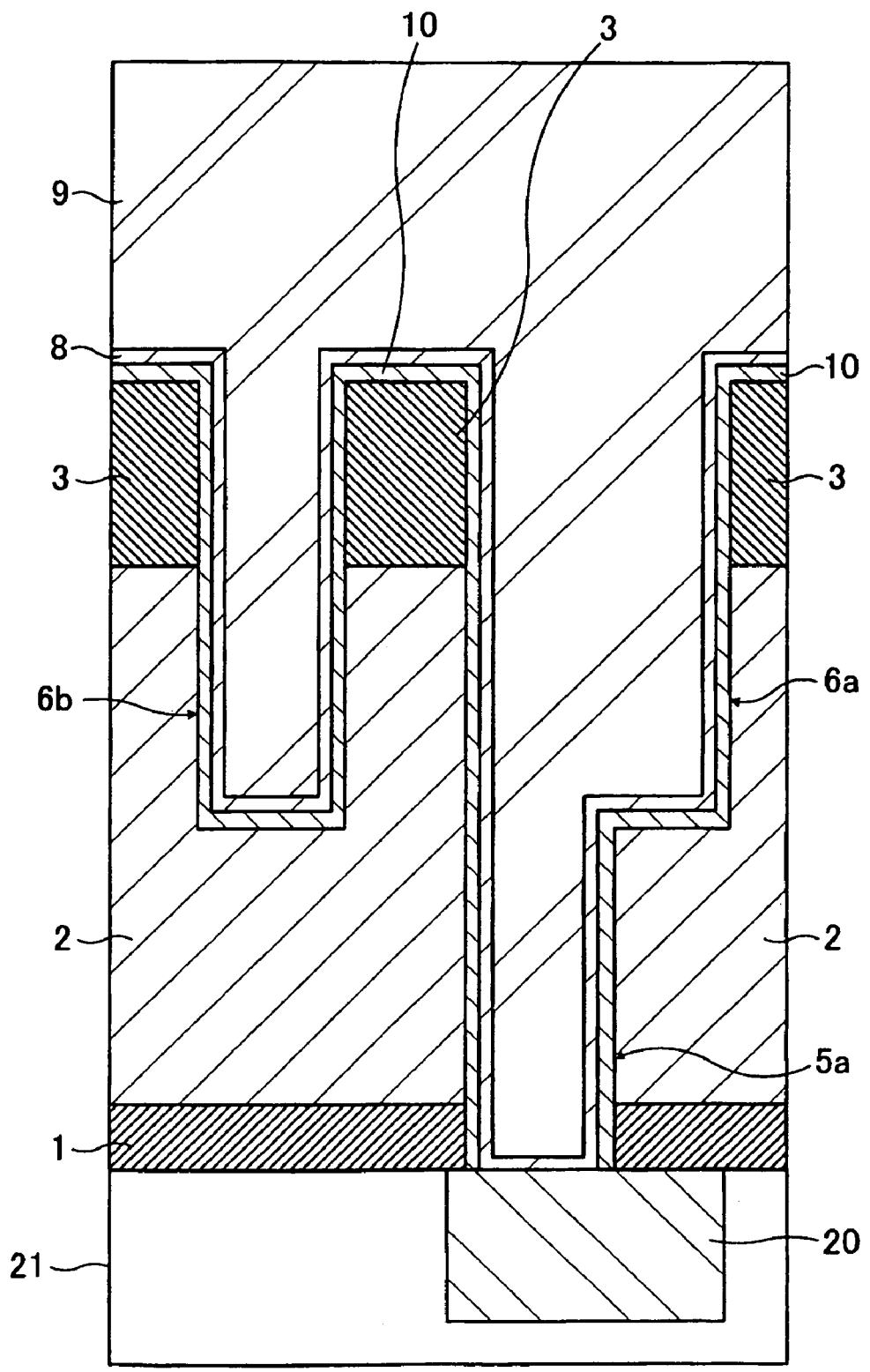
FIG. 10 is a schematic sectional view showing an essential part of a burying step of copper according to a second embodiment.
Figure 11:
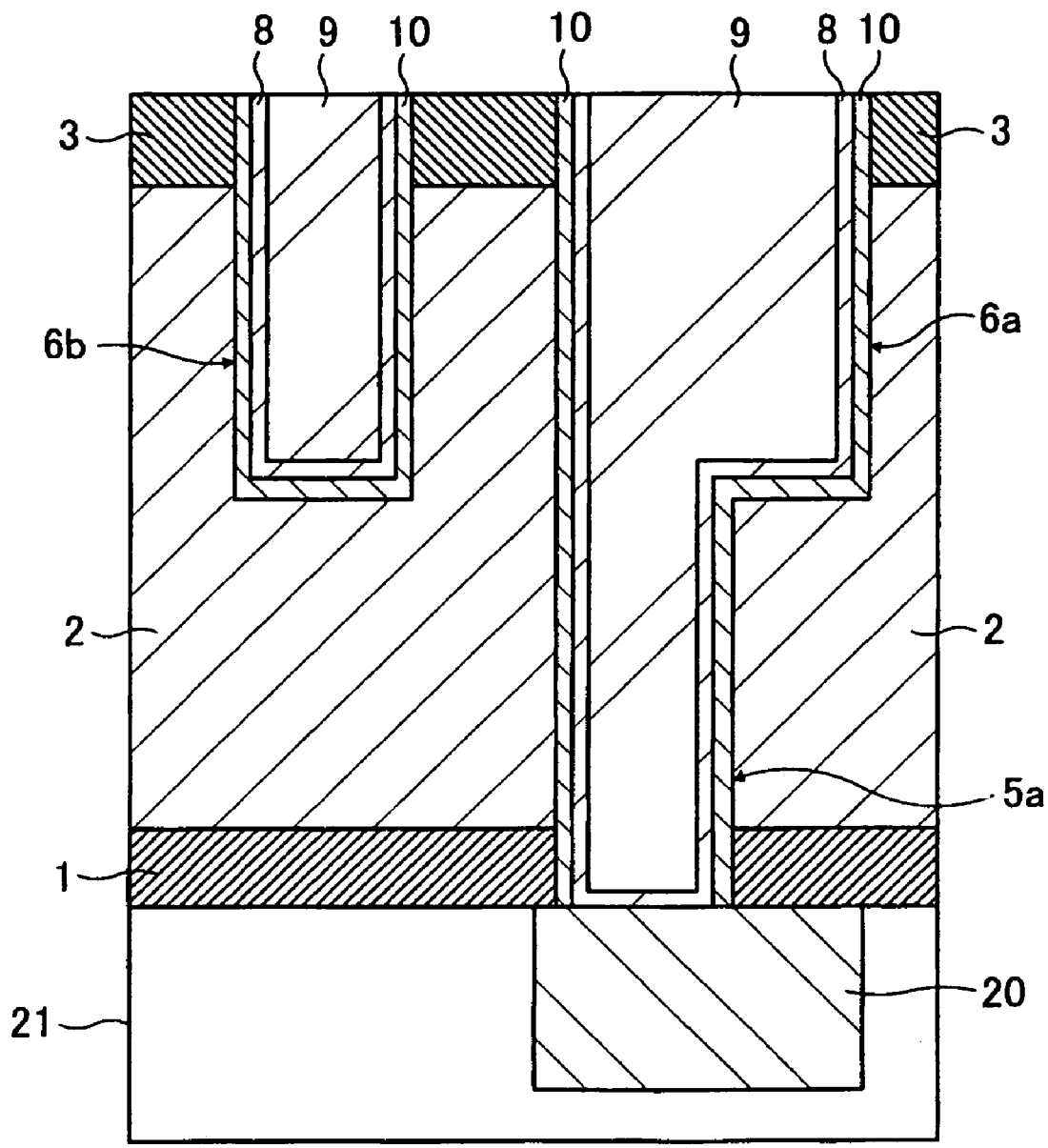
FIG. 11 is a schematic sectional view showing an essential part of a formation step of a via and a copper wiring according to a second embodiment.

FIG. 9 is a schematic sectional view showing an essential part of a formation step of a barrier metal according to the second embodiment. FIG. 10 is a schematic sectional view showing an essential part of a burying step of copper according to the second embodiment. FIG. 11 is a schematic sectional view showing an essential part of a formation step of a via and a copper wiring according to the second embodiment. In FIGS. 9 to 11, the same elements as those described in FIGS. 1, 2 and 8 are indicated by the same reference numerals as in FIGS. 1, 2 and 8.

After the formation of the thin film 10, in the same manner as in the first embodiment, a Ta film 8 having a film thickness of about 2 to 25 nm is first formed as a barrier metal throughout the whole area of the film 10 by a DC magnetron sputtering method, as shown in FIG. 9. By the formation of the thin film 10, the side wall of the via hole 5a and the bottoms or side walls of the wiring grooves 6a and 6b are planarized and therefore, the Ta film 8 also is formed with good planarity. Further, at the formation of the Ta film 8, the bottom of the via hole 5a is preferentially sputtered. Therefore, the thin film 10 on the bottom of the via hole 5a is easily removed at the formation of the Ta film 8. As a result, the Ta film 8 is directly formed on the lower copper wiring 20.

After the formation of the Ta film 8, in the same manner as in the first embodiment, seed copper (not shown) is formed on the film 8. Then, copper plating is performed to bury plating copper 9 in the via hole 5a and the wiring grooves 6a and 6b, as shown in FIG. 10. On this occasion, when the Ta film 8 is formed with good planarity, the seed copper is also formed with good planarity. As a result, the plating copper 9 is also formed with good orientation.

After the burying of the plating copper 9, as shown in FIG. 11, the plating copper 9 and the Ta film 8 are shaved off by the CMP process until the TEOS film 3 is exposed. As a result, each plating copper 9 buried in the wiring grooves 6a and 6b is separated from each other. Thus, the upper copper wiring is completed.

The thus formed multilayer wiring structure having no MES is subjected to the electromigration resistance test. As a result, remarkable improvement of the electromigration resistance is confirmed, similarly to the first embodiment.

As described above, according to the semiconductor device manufacturing method of the second embodiment, when forming the via and the copper wirings in the multilayer wiring structure having no MES by the dual damascene technique, the thin film 10 is formed after the etching of the SiC film 1 so that the surfaces of the via hole 5a as well as of wiring grooves 6a and 6b can be planarized. Therefore, the subsequently formed Ta film 8 or seed copper is thinly formed with good planarity, so that the plating copper 9 can be formed with good orientation. Accordingly, reliability of the semiconductor device comprising the fine multilayer wiring structure having no MES can be remarkably improved.

In addition, when the insulating thin film 10 is formed particularly at least on the bottoms of the wiring grooves 6a and 6b, in which the surface roughness easily occurs, among the side wall of the via hole 5a and the bottoms or side walls of the wiring grooves 6a and 6b, reliability of the semiconductor device can be improved.

As described above, when forming the via hole opening and the wiring grooves in the layer structure having no MES between Low-K insulating films by the dual damascene technique, the following methods are used to perform the planarization of the surfaces of the opening and wiring grooves. That is, one is a method of performing the etching of the SiC film under such conditions that the planarity of the surfaces of the opening and wiring grooves, particularly, of the bottoms of the wiring grooves is improved. The other is a method of forming the deposited film of the etching products on the surfaces of the opening and wiring grooves, particularly, on the bottoms of the wiring grooves, or forming thereon a new thin film after the etching of the SiC film. As a result, the planarization of the barrier metal and the improvement in the orientation of the copper wiring can be realized, so that a highly reliable semiconductor device having the multilayer wiring structure can be achieved.

In the foregoing description, the method of using the Low-k insulating film as an interlayer insulating film is described as an example. Further, the above-described method is similarly applicable also to the method of using a conventional widely-used insulating film such as a $SiO_2$ film.

In the foregoing description, the method of performing the etching using one of a $CH_2F_2$ gas, a $CHF_3$ gas and a $C_4F_6$ gas as an etching gas is described as an example. Further, the etching can also be performed using a mixed gas containing two or more of these gases under suitable conditions.

In the present invention, when forming the multilayer wiring structure having no MES by using the dual damascene technique, the following methods are used. One is a method of performing the etching of the ESL as well as forming the deposited film of the etching products on the interlayer insulating film surface where the via hole and the wiring grooves are formed. The other is a method of performing the etching of the ESL and then forming the insulating thin film on the interlayer insulating film surface where the via hole and the wiring grooves are formed. As a result, the interlayer insulating film surface which is exposed to plasma during the etching can be planarized. Therefore, the barrier characteristics of the subsequently formed barrier metal as well as the orientation of the copper wiring can be improved. Accordingly, a highly reliable semiconductor device can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device having a multilayer wiring structure, comprising the steps of:
    forming an etch stop layer on a layer having formed thereon a lower copper wiring;
    forming an interlayer insulating film on the etch stop layer;
    etching the interlayer insulating film to form an opening that reaches the etch stop layer;
    etching the interlayer insulating film to form a wiring groove that communicates with the opening;
    etching the etch stop layer on the bottom of the opening to form a via hole as well as forming a deposited film of etching products on surfaces of the via hole and the wiring groove; and
    forming a barrier metal in the via hole and the wiring groove by a sputtering method;
    wherein in the step of forming the barrier metal by the sputtering method, the deposited film of the etching products on the bottom of the via hole is preferentially sputtered and removed, and the barrier metal is formed in a state where the deposited film of the etching products on the bottom of the via hole is removed,
    wherein in the step of etching the etch stop layer on the bottom of the opening to form the via hole that communicates with the lower copper wiring as well as forming the deposited film of the etching products on the surfaces of the via hole and the wiring groove,
    the etch stop layer on the bottom of the opening is etched to form the via hole as well as the deposited film of the etching products is formed on the surfaces of the via hole and the wiring groove such that the surface roughness on the bottom of the wiring groove is 1 nm or less.

2. The method according to claim 1, further comprising the step of:
    burying copper in the via hole and the wiring groove, after the step of forming the barrier metal in the via hole and the wiring groove.

3. The method according to claim 1, wherein:
    in the step of etching the etch stop layer on the bottom of the opening to form the via hole as well as forming the deposited film of the etching products on the surfaces of the via hole and the wiring groove, the deposited film of the etching products is formed to a film thickness of 1 to 20 nm.

4. The method according to claim 1, wherein:

in the step of etching the etch stop layer on the bottom of the opening to form the via hole that communicates with the lower copper wiring as well as forming the deposited film of the etching products on the surfaces of the via hole and the wiring groove, when using a hydrofluorocarbon gas as an etching gas, the etching is performed using a mixed gas comprising the hydrofluorocarbon gas with a flow rate of 1 to 200 sccm, an $O_2$ gas with a flow rate of 1 to 200 sccm, an $N_2$ gas with a flow rate of 1 to 200 sccm and an Ar gas with a flow rate of 0 to 1000 sccm under conditions that a pressure is 1 to 300 mTorr, a supply power is 100 to 1000 W and a magnetic field is 0 to 100 G.

5. The method according to claim 4, wherein:

the hydrofluorocarbon gas flow rate is set larger than the $O_2$ gas flow rate.

6. The method according to claim 4, wherein:

the hydrofluorocarbon gas is a $CH_2F_2$ gas or a $CHF_3$ gas.

7. The method according to claim 1, wherein:

in the step of etching the etch stop layer on the bottom of the opening to form the via hole that communicates with the lower copper wiring as well as forming the deposited film of the etching products on the surfaces of the via hole and the wiring groove, when using a fluorocarbon gas as an etching gas, the etching is performed using a mixed gas comprising the fluorocarbon gas with a flow rate of 1 to 200 sccm, an $O_2$ gas with a flow rate of 1 to 200 sccm, a $N_2$ gas with a flow rate of 1 to 200 sccm and an Ar gas with a flow rate of 0 to 1000 sccm under conditions that a pressure is 1 to 300 mTorr, a supply power is 100 to 1000 W and a magnetic field is 0 to 100 G.

8. The method according to claim 7, wherein:

the fluorocarbon gas flow rate is set larger than the $O_2$ gas flow rate.

9. The method according to claim 7, wherein:

the fluorocarbon gas is a $C_4F_6$ gas.

10. The method according to claim 1, wherein a surface roughness of the wiring groove is 1 nm or less.

11. A method for manufacturing a semiconductor device having a multilayer wiring structure, comprising the steps of:

forming an etch stop layer on a layer having formed thereon a lower copper wiring;

forming an interlayer insulating film on the etch stop layer;

etching the interlayer insulating film to form an opening that reaches the etch stop layer;

etching the interlayer insulating film to form a wiring groove that communicates with the opening;

etching the etch stop layer on the bottom of the opening to form a via hole that communicates with the lower copper wiring;

forming an insulating thin film on surfaces of the via hole and the wiring groove; and forming a barrier metal in the via hole and the wiring groove by a sputtering method;

wherein in the step of forming the barrier metal by the sputter method, the insulating thin film on the bottom of the via hole is preferentially sputtered and removed, and the barrier metal is formed in a state where insulating thin film on the bottom of the via hole is removed, wherein in the step of forming the insulating thin film on the surfaces of the via hole and the wiring groove, the insulating thin film is formed on the surfaces of the via hole and the wiring groove such that the surface roughness on the bottom of the wiring groove is 1 nm or less.

12. The method according to claim 11, further comprising the step of:

burying copper in the via hole and the wiring groove, after the step of forming the barrier metal in the via hole and the wiring groove.

13. The method according to claim 11, wherein:

in the step of forming the insulating thin film on the surfaces of the via hole and the wiring groove, the insulating thin film is formed using plasma.

14. The method according to claim 11, wherein:

in the step of forming the insulating thin film on the surfaces of the via hole and the wiring groove, the insulating thin film is constructed by a SiO film, a SiOC film, a SiC film, a SiN film, an amorphous carbon film or a hydrocarbon film.

15. The method according to claim 11, wherein:

in the step of forming the insulating thin film on the surfaces of the via hole and the wiring groove, the insulating thin film is formed to a film thickness of 1 to 30 nm.

* * * * *